United States Patent [19]
Kang et al.

[11] Patent Number: 6,114,413
[45] Date of Patent: Sep. 5, 2000

[54] THERMALLY CONDUCTING MATERIALS AND APPLICATIONS FOR MICROELECTRONIC PACKAGING

[75] Inventors: Sung Kwon Kang, Chappaqua; Sampath Purushothaman, Yorktown Heights; Eva E. Simonyi, Bronx, all of N.Y.

[73] Assignee: International Business Machines Corporation, Armonk, N.Y.

[21] Appl. No.: 09/111,400

[22] Filed: Jul. 7, 1998

Related U.S. Application Data

[60] Provisional application No. 60/052,171, Jul. 10, 1997.

[51] Int. Cl.$^7$ ........................................ C08K 9/00
[52] U.S. Cl. ........................................ 523/210; 523/205
[58] Field of Search ..................................... 523/200, 205

[56] References Cited

U.S. PATENT DOCUMENTS 5,288,769  2/1994  Papageorge et al. .

*Primary Examiner*—Edward J. Cain
*Attorney, Agent, or Firm*—Ohlandt, Greeley, Ruggiero & Perle, L.L.P.

[57] ABSTRACT

A conductive paste structure is is disclosed which is a combination of a polymeric material and particles, e.g. Cu, having a thermally conductive coating, e.g. Sn. Heat is applied to fuse the coating of adjacent particles. The polymeric material is a thermoplastic. The conductive paste structure is disposed between two thermally conductive surfaces, e.g.chip and substrate pads, to provide thermal interconnection and adhesion between their pads.

29 Claims, 3 Drawing Sheets

THERMALLY CONDUCTING MATERIALS AND APPLICATIONS FOR MICROELECTRONIC PACKAGING

This patent application claims priority from Provisional Application Ser. No. 60/052,171, filed Jul. 10, 1997 and entitled THERMALLY CONDUCTING MATERIALS AND APPLICATIONS FOR MICROELECTRONIC PACKAGING, of Kang et al.

FIELD OF THE INVENTION

The present invention relates to thermally conducting materials, and more particularly to adhesive materials containing thermally conducting filler materials, adhesive matrix polymers, and other ingredients.

BACKGROUND OF THE INVENTION

Thermal management in an electronic system is a critical task to ensure the system's functionality as well as to maintain the reliability of its key components. Heat is mostly generated by active devices, such as logic and memory chips. Heat dissipation from an active device has been therefore an important design consideration, particularly due to the increase in the number of circuits per unit area. Thermal conduction mechanisms have been commonly employed to dissipate the heat from an active device by attachment of a heat sink or via a heat spreader attached to a heat sink. To attach a heat sink or a heat spreader to an active device, it is necessary to use a joining material, which should possess a good thermal conductivity among other properties. Otherwise, the joint between an active device and a heat sink becomes a bottleneck in terms of heat dissipation.

Silver-filled epoxy or other polymer resin materials as schematically shown in FIG. 1, are most commonly used as thermally conducting die-attach materials in microelectronics packages. See, for instance U.S. Pat. Nos. 5,391,604 (Dietz et al.), 5,399,907 (Nguyen et al.) 5,447,988 (Dershem et al.), 5,475,048 (Jamison et al.), 5,488,082 (Dietz et al.), and 5,504,374 (Oliver et al.).

Solder alloys are also used for thermally conducting joining materials. Silver-filled epoxy materials have several short-comings, such as low thermal conductivity, low joint strength, long curing cycle, etc.. Most solder alloys contain lead (Pb) as a major component which is not environment-friendly. Additionally, lead solder joints can form intermetallic compounds which, in turn, can lead to brittle interfaces that separate under thermal cycles.

In earlier patent applications, assigned to the same Assignee as is this application, the disclosures of which are incorporated herein by reference, electrically conductive paste materials are disclosed which can be used for thermal conduction applications:

Ser. No. 08/641,406; entitled "Electrically Conductive Paste Materials; Graham et al.

Ser. No. 08/414,070; entitled "Dendritic Powder Materials for High Conductivity Paste Application; Kang et al.

Ser. No. 08/868,771, entitled "Electrodeposition of Low Temperature, High Conductivity, Powder Materials from Electrically Conductive Paste Formulations"; Kang et al.

Ser. No. 08/877,991; entitled "High-Conductivity, High Strength, Lead-Free, Low Cost, Electrically Conducting Materials and Applications"; Gelorme et al.

These electrically and thermally conductive paste materials comprise conducting filler particles dispersed in a matrix of thermoplastic polymer resin with other ingredients. They were developed as Pb-free, non-toxic and environment-friendly, assembly materials for electronic applications.

In one embodiment (Ser. No. 08/641,106), a new electrically conductive paste is disclosed made of tin-coated copper powder, polyimide-siloxane, solvent, carboxylic acid/surfactant, and no-clean flux. A joining operation can be performed with such a paste near the melting point of Sn, 230° C., where a metallurgical bonding of Sn-to-Sn or Sn-to-Au or Cu is accomplished at the particle-to-particle as well as the particle-to-substrate pad interfaces. Because of the metallurgical bonding, higher electrical conductivity and higher joint strengths were demonstrated, as compared to joints made with silver-filled epoxy materials. The metallurgical bonds also provided stable electrical conductivity upon thermal exposure and cycling.

In co-pending application, filed on even date herewith and entitled "Method of Fabricating Coated Powder Materials and Their Use for High Conductivity Paste Applications" to Kang et al, Ser. No. 09/111,155, a new electrically conductive paste is disclosed made of bismuth-tin coated copper powder, thermoplastic polymer resin, solvent, and no-clean flux. A joining operation thereof can be performed near the eutectic temperature of the Bi-Sn alloy, which is about 139° C.

In another embodiment (Ser. No. 08/868,7710), a new electrically conductive paste is disclosed made of indium-tin coated copper powder, thermoplastic polymer resin, solvent, and no-clean flux. A joining operation can be performed near the eutectic temperature of the In-Sn alloy, which is 120° C.

It is an object of the present invention to provide a thermally conductive adhesive material which is environmentally safe and low cost.

It is another object of the present invention to provide a thermally conductive adhesive material which produces a higher thermal conductivity than does conventional silver-filled epoxy.

It is a further object of the present invention to provide a thermally conductive adhesive material which produces a higher joint strength than conventional silver-filled epoxy.

It is a still further object of the present invention to provide a method of fabricating a thermally conductive adhesive material which can be processed at a lower temperature than the reflow temperature of a Pb-Sn eutectic solder paste.

It is yet another object of the present invention to provide a thermally conductive adhesive material which produces a more reliable joint than conventional silver-filled epoxy.

SUMMARY OF THE INVENTION

Broadly stated, the present invention is a thermally conductive material formed from a plurality of particles, each having a thermally conductive coating which is fused to a thermally conductive coating on an adjacent particle to form a network of fused particles.

The present invention also comprises a paste composition containing particles having a coating of a thermally conductive material and a polymer material.

Another aspect of the present invention is a method of forming a thermally conductive joint between two surfaces by forming a paste of particles, having a conductive coating and a polymeric material, wherein the paste is disposed between two surfaces to be adhesively and thermally joined. Heat and pressure are provided to fuse the thermally conductive particles to themselves, to metallurgically bond them to the contact surfaces, and to cure the polymeric material.

BRIEF DESCRIPTION OF THE DRAWINGS

Further objects, features, and advantages of the present invention will become apparent from a consideration of the following detailed description of the invention when read in conjunction with the drawing FIGs., in which.

DETAILED DESCRIPTION OF THE INVENTION

In a first embodiment, a thermally conductive paste material is disclosed that comprises tin-coated copper powder, polyimide-siloxane, solvent (N-methyl pyrrolidione or NMP) and carboxylic acid/surfactant. A joining operation can be performed near the melting point of Sn, 230° C., where a metallurgical bonding of Sn-to-Sn is accomplished at the particle-to-particle interface while a Sn-to-Sn or Sn-to-Au or Cu bonding is accomplished at the particle-to-substrate interfaces.

The joining process can be either solid-state or a liquid-solid reaction. The polymer curing process can be combined with the joining process, depending on the paste formulation. Because of the metallurgical bonding, a higher thermal conductivity occurs with joints made with the new paste material than with those made with a silver-epoxy material. The metallurgical bonds also provide stable thermal conductivity of the new joints upon thermal exposure and cycling. Such joints exhibit good joint strength from the combined effects of the metallurgical and adhesive bonds.

Depending on the applications, the particle size of tin-coated powder, composition of the polymer matrix and volume fraction of the filler material can be adjusted. Since the present conductive paste is primarily based on the metallurgical bonds, the critical volume fraction of the filler material required to achieve acceptable conductivity levels is much less than the conventional Ag-epoxy paste, which relies on physical contact between particles. Moreover, in the Ag-epoxy paste, the presence of a thin polymeric layer between particles can increase thermal resistance significantly. This problem is obviated by the particle-to-particle bonding in a paste configured in accord with the present invention In a further embodiment, polymer resins are prepared from renewable resources or bio-based materials after appropriate functionalization to achieve the desirable thermal and Theological properties. See for example, the final report of NSF Grant # BCS 85-12636 by W. G. Glasser and T. C. Ward. Lignin (a by-product from paper manufacture), cellulose, wood or crop oils are potential candidates for this purpose. Use of the materials is environmentally preferable because they are derived from natural and renewable resources and can be disposed of more readily at the end of the useful life of the electronic assembly. This is particularly attractive because the use of the Cu-Sn powder eliminates the use of lead (Pb)containing solders and the resulting paste formulation is non-toxic and is easily disposable.

Figure 1:
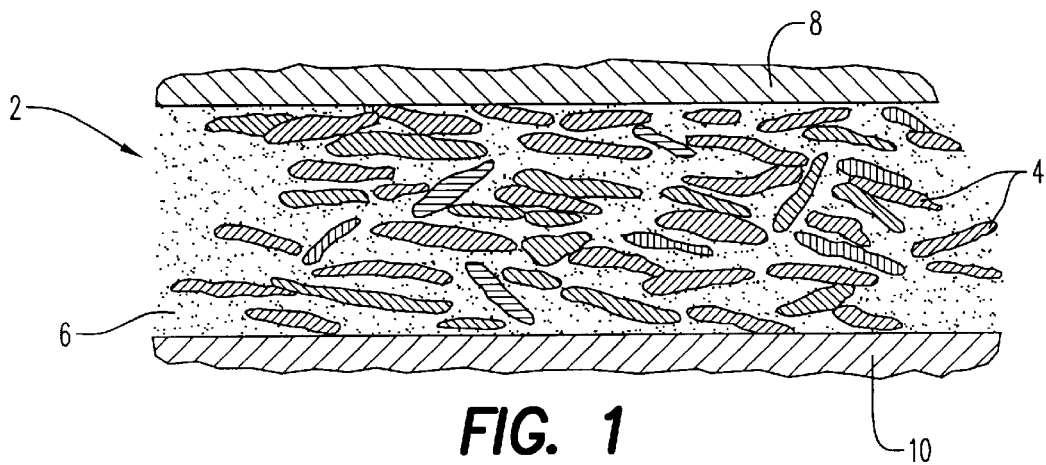
FIG. 1 is a schematic illustration of a thermally and electrically conductive adhesive material comprising silver flake particles as a filler in the matrix of epoxy resin (prior art)
Figure 2:
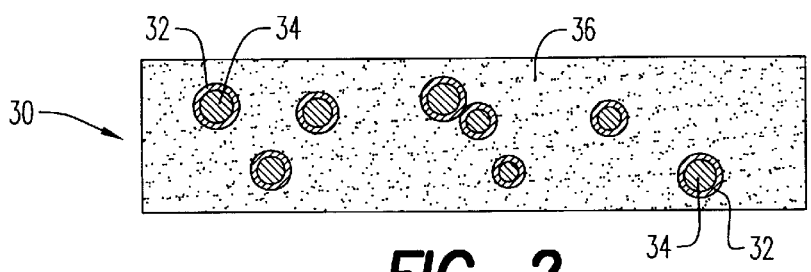
FIG. 2 is a schematic illustration of a thermally and electrically conductive adhesive material, comprising copper powder, filled in the matrix of a thermoplastic or thermosetting polymer resin. The copper particles are coated with a low melting point, non-toxic metal such as tin, indium, bismuth, antimony or combinations thereof.

FIG. 2 illustrates a thermally conductive paste (TCP) material 30, according to the present invention, comprising particles 34 having a thermally conducting coating 32, as conducting filler materials, and a polymer matrix 36. Particles 34 are preferably Cu particles. Any powder material with a high thermal conductivity, such as diamond, aluminum nitride, etc., coated with metals such as Cu, Ni or Pd can also be used instead of copper.

Coating 32 is preferably tin, indium, and bismuth antimony or combinations thereof. The polymer matrix is preferably a thermoplastic, most preferably a polyimide siloxane or phenoxy polymer or styrene allyl alcohol, or a thermosetting polymer such as an epoxy.

In a preferred embodiment, the first step of applying a tin-plating to the copper powder is the cleaning of a fine copper powder in a dilute sulfuric acid. The copper powder is preferably spherical in shape, having a size distribution of 2 to 8 $\mu$m in diameter (obtained from Degussa Corporation, South Plainfield, N.J.) Tin plating is performed on the clean copper powder in an immersion tin plating solution (TINPOSIT LT-34, from Shipley, Newton, Mass.). The optimum thickness of tin is 0.3 to 0.5 $\mu$m on 5–7 $\mu$m Cu powder. After rinsing, the tin-plated copper powder is immediately mixed with a no-clean flux (e.g., FLUX 305, from Qualitek International, Inc., Addison, Ill.). This prevents the tin-plated copper powder from oxidizing until it is processed into a conductive paste.

The tin-plated copper powder is formulated into a conducting paste by mixing with polyimide siloxane, or phenoxy polymer or styrene allyl alcohol, NMP solvent or ethyl benzoate, butyric acid and ethylene glycol. The relative amount of filler powder over the polymer matrix is varied from 30 to 90% in weight, depending on the application. In general, for isotropic conduction, a high filler weight percent is required, while a low filler weight percent is required for anisotropic applications (higher conductivity out-of-plane as compared to in-plane).

To insure uniform dispersion of the ingredients, the mixture is processed in a three-roll shear mill. The viscosity is also controlled by adjusting the volume fraction of the filler powder in the paste. When the filler weight percent is low, for example, 30% in weight, a solvent drying process, for example, at 100° C., 1 hour, is required to adjust the viscosity of the paste before dispensing the paste onto a desired foot print and to avoid excessive shrinkage voiding of the thermal joints.

In order to characterize the electrical and mechanical properties, joined samples made of the tin-plated copper-filled conductive paste were manufactured by laminating two "L-shaped" copper coupons. The lamination is performed at a temperature slightly above the melting point of Sn, for example, 250° C., at a pressure of 25 psi.

Figure 3:
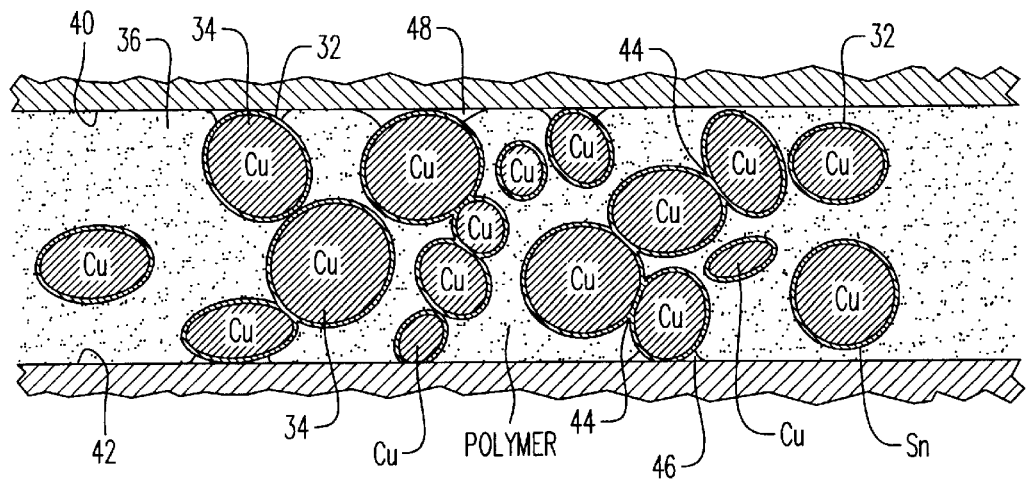
FIG. 3 is a schematic illustration of an interconnection made with the present invention material, e.g., comprising copper particles coated with tin and other metals, wherein the coated particles are mixed in a matrix of a thermoplastic polymer resin. Metallurgical bonds are formed among the adjacent particles as well as between the contact surfaces and the particles adjacent to these surfaces.

The joint structure of the thermally conductive paste material of the present invention is schematically shown in FIG. 3. The paste was disposed between surfaces 40 and 42 and heated to the reflow temperature, which caused conductive coating 32 of a particle 34 to fuse to conductive coating 32 of an adjacent particle 34 to form a bond 44 therebetween. Additional metallurgical bonds 46 were also formed between contact surfaces 42 and the particles adjacent to these surfaces.

In order to compare the conductivity values, other joined samples were also fabricated, with a similar process, using commercial Ag-epoxy and Sn/Pb eutectic solder paste materials. The joined samples made of the paste according to the present invention showed the lowest electrical resistance values; for example, $2.6 \times 10^{-5}$ ohm for Sn-plated Cu paste, $4.7 \times 10^{-5}$ ohm for Sn/Pb solder paste, and $7.3 \times 10^{-5}$ ohm for Ag-epoxy, for a contact area of about 0.050 inch by 0.050 inch.

The resistance of the paste according to the present invention is even lower than that of the Sn/Pb solder paste. This can be attributed to the difference in the bulk conductivities of copper versus Sn/Pb solder.

Measurements of the joint strength have also demonstrated that a joint made using the paste according to the present invention has a higher joint strength than that made of the Ag-epoxy paste.

Thermal conductivity of the paste according to the present invention was measured from a sample consisting of two copper cylinders joined by using the paste material at a pressure of 25 psi at 250° C.. The thickness of the thermal paste layer was on the order of 0.001 to 0.002". The effective thermal conductivity measured from this sample was in the range between 5 to 15 W/m °K. This thermal conductivity value is superior to that of a commercial silver-filled epoxy material with a value of 1 to 2 W/m°K.

Examples of structures wherein the new thermally conductive paste materials according to the present invention can be used include: die attach to a heat sink, direct chip attach to a heat spreader, and a thermal via or thermal plug. The specific make up of these paste materials is:

copper powder coated with a thin layer of low melting point, non-toxic metals, such as Sn, In, Bi, Sb, and their alloys, mixed with an environmentally-safe fluxing agent, such as no-clean or water-soluble flux, and polymer resins.

tin-coated copper powder, mixed with polyimide siloxane, NMP solvent, and butyric acid and ethylene glycol or no-clean flux.

tin-coated copper powder, mixed with phenoxy polymer, ethyl benzoate, and butyric acid and ethylene glycol or no-clean flux.

tin-coated copper powder, mixed with styrene allyl alcohol, ethyl benzoate, and butyric acid and ethylene glycol or no-clean flux.

tin-coated copper powder, mixed with reworkable epoxy such as acetal di-epoxide, and butyric acid and ethylene glycol or no-clean flux.

tin-coated copper powder, mixed with thermoset epoxies such as bisphenol, aliphatic and/or cycloaliphatic resins, and butyric acid and ethylene glycol or no-clean flux.

tin-coated copper powder, mixed with renewable or bio-based polymer resin, a suitable solvent, and butyric acid and ethylene glycol or no-clean flux.

indium-coated or indium and tin-coated copper powder, mixed with polyimide siloxane, NMP solvent, and butyric acid and ethylene glycol or no-clean flux.

indium-coated or indium and tin-coated copper powder, mixed with phenoxy polymer, ethyl benzoate and butyric acid and ethylene glycol or no-clean flux.

indium-coated or indium and tin-coated copper powder, mixed with renewable or bio-based polymer resin, a suitable solvent, and butyric acid and ethylene glycol or no-clean flux.

bismuth/tin alloy-coated copper powder, mixed with renewable or bio-based polymer resin, a suitable solvent, and butyric acid and ethylene glycol or no-clean flux.

bismuth/tin alloy-coated copper powder, mixed with phenoxy polymer, ethyl benzoate, and butyric acid and ethylene glycol or no-clean flux.

an optimized formulation for the die attach application, comprising indium-coated copper powder of 30 to 90% in weight, polyimide siloxane, NMP solvent, and butyric acid and ethylene glycol or no-clean flux.

an optimized formulation for the direct attach of heat spread application, comprising indium-coated copper powder of 30 to 90% in weight, polyimide siloxane, NMP solvent, and butyric acid and ethylene glycol or no-clean flux.

an optimized formulation for the thermal via or thermal plug application, comprising tin-coated copper powder of 30 to 90% in weight, polyimide siloxane, NMP solvent, and butyric acid and ethylene glycol or no-clean flux.

high conductivity powder materials such as diamond, aluminum nitride, boron nitride, etc., coated with metals such as Cu, Ni or Pd, and coated with low melting point metals such as Sn, In, Bi, Sb, and others, mixed with an environmentally-safe fluxing agent, and polymer resins.

Figure 4:
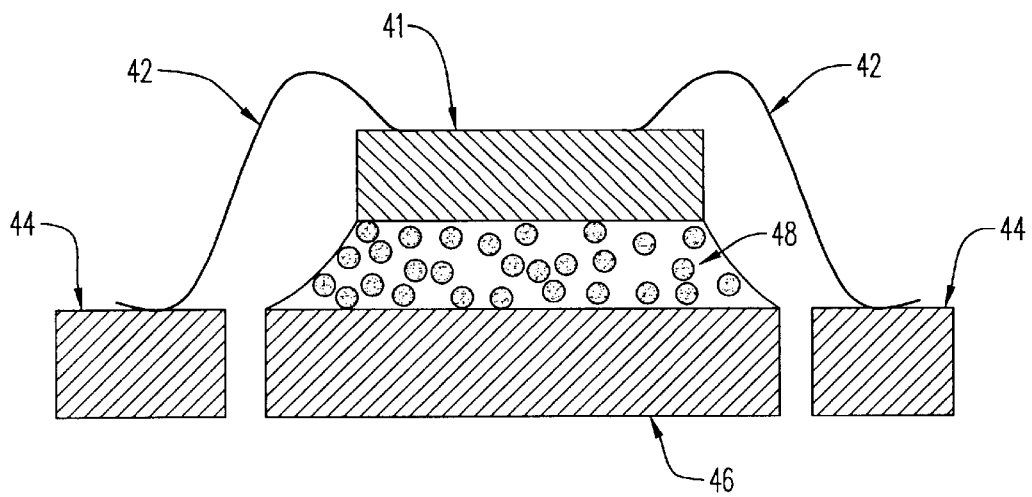
FIG. 4 is a schematic cross-sectional illustration representing a heat generating device, for example, an integrated circuit (IC) die, attached to a heat sink or heat spread structure by a thermally conductive adhesive according to the invention.

FIG. 4 depicts an IC device 41 attached to a lead-frame structure 46 through use of thermally conductive paste 48 having a composition in accord with the present invention. Electrical interconnection to IC 41 is accomplished by conventional wire bonding 42 between IC 41 and a lead frame structure 44. The major heat dissipation occurs through the back side of IC 41 via thermally conductive paste 48 to the lead frame 46 as a heat spreader. Because of a high thermal conductivity of the new thermally conductive paste material, heat dissipation is highly efficient.

Figure 5:
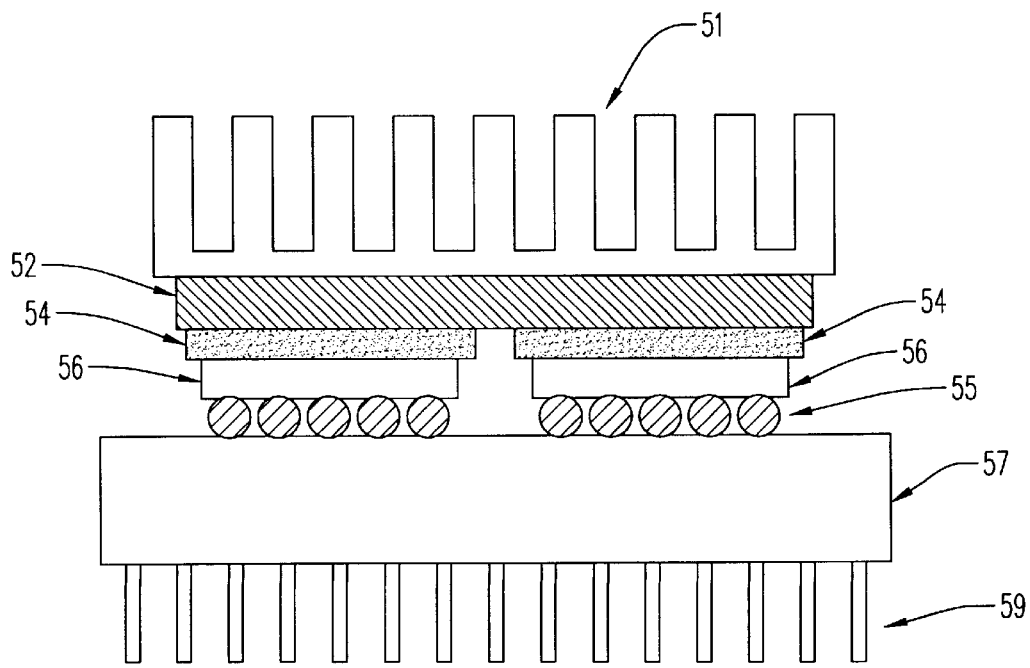
FIG. 5 is a schematic cross-sectional illustration representing an electronic module mounted with two IC devices, in which the devices are electrically connected to the module via solder bump interconnections and are thermally connected to a heat spreader by using a thermally conductive paste developed according to the present invention. The heat spreader is further mounted on a heat sink structure.

FIG. 5 depicts an electronic packaging module where two IC devices 56 are mounted to a printed wiring board 57 via solder bumps 55. The back sides of ICs 56 are attached to a heat spreader 52 by use of a thermally conductive paste 54 prepared in accord with the present invention. Heat spreader 52 is again attached to a heat sink 51. Because of the high thermal conductivity of the present paste material, the thermal resistance between an IC and a heat spreader is lower than that realized with the structure where a conventional material, such as a thermal grease, is used.

Figure 6:
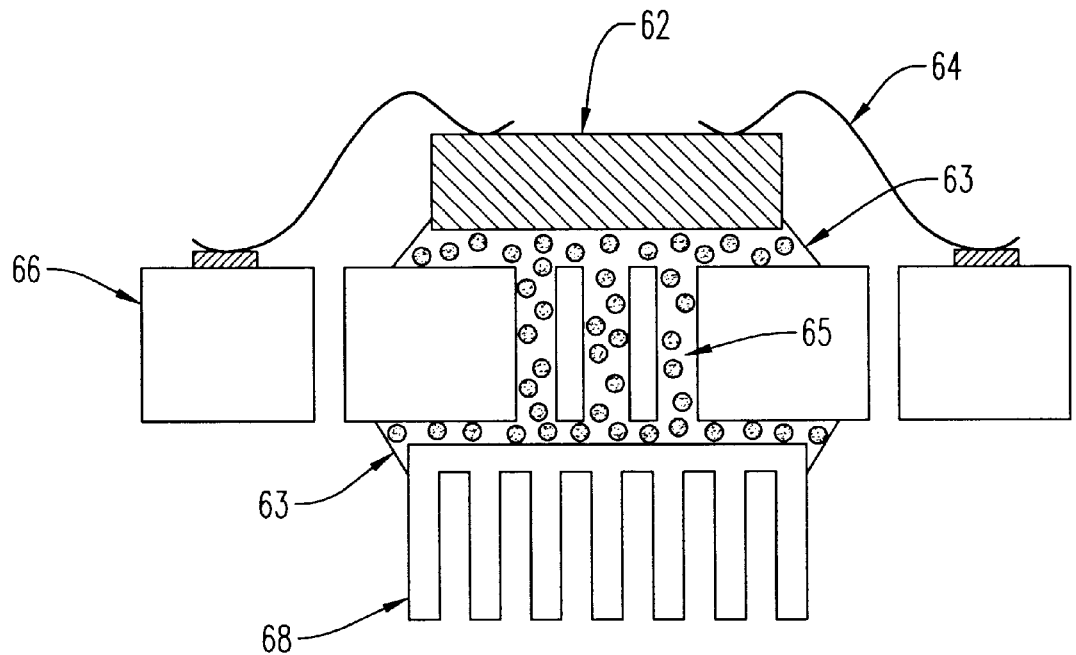
FIG. 6 is a schematic illustration of an electronic packaging module or printed circuit board which contains a thermal via structure or thermal plug made of a thermally conductive paste material according to the present invention.

FIG. 6 depicts an application with a printed circuit board or electronic module which contains thermal vias or plugs within its structure. A high performance, high power, IC device 62 is electrically connected to a printed circuit board or module 66 via wire bonding 64, while a major thermal path is provided by thermal vias or plugs 65. The thermal vias or plugs are filled with the new thermal paste materials comprising conducting filler particles and polymer resins. A heat sink 68 is attached to the back side of the printed circuit board or module 66 by use of the same thermal paste material 63 used to form the thermal vias or plugs.

This structure provides several advantages over the conventional thermal vias or plugs which are formed either by electroplating the via holes or by reflowing solder paste to fill them. The conventional structure requires plating as well as additional assembly processes and the use of thermal paste materials to attach a device and a heat sink to the printed circuit board.

Figure 7:
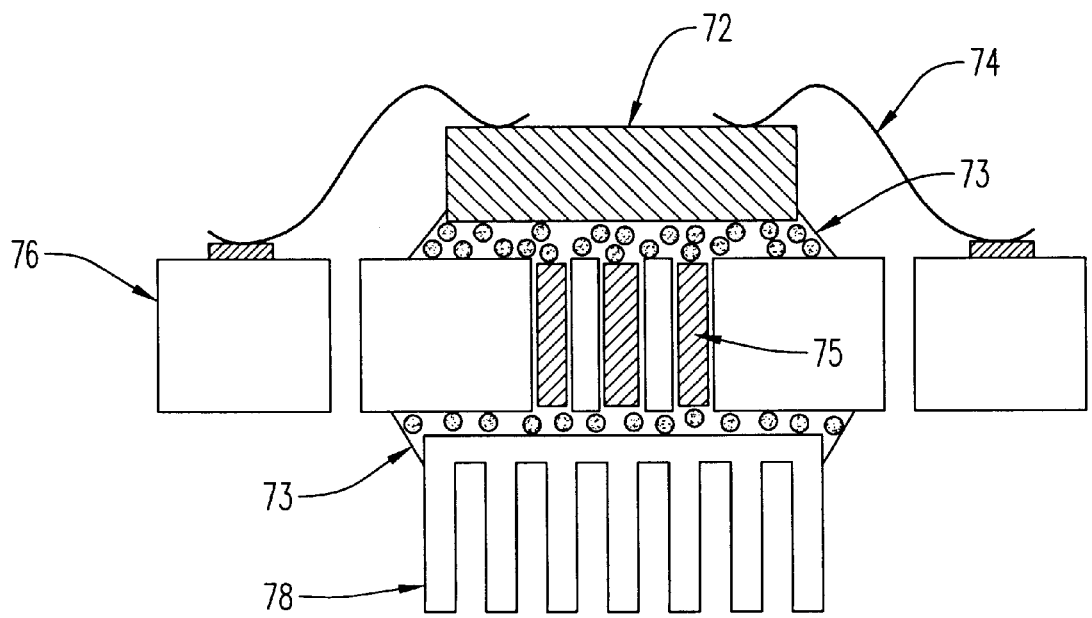
FIG. 7 is a schematic illustration of an electronic packaging module or printed circuit board which contains a thermal via structure or thermal plug made of plated copper, where a chip and a heat spreader are attached to the structure by use of the new thermally conductive adhesive materials developed according to the present invention.

One variation of this structure can be a conventional thermal via structure of a printed circuit board, as schematically shown in FIG. 7, where a chip 72 and a heat spreader 78 are attached to the thermal vias 75 by use of the new thermally conductive adhesives developed according to the present invention.

While the present invention has been described with respect to preferred embodiments, numerous modifications, changes, and improvements will occur to those skilled in the art without departing from the spirit and scope of the invention.

What is claimed is:

1. A structure comprising:
   a plurality of high thermal conductivity particles;
   each of said plurality of particles including a thermally conductive, fusible coating, said coating selected from the group consisting of Sn, Zn, In, Bi and Sb, and combinations thereof;
   at least some of said particles fused to other said particles by said thermally conductive fusible coating.

2. A structure according to claim 1, wherein said plurality of high thermal conductivity particles are embedded within a polymeric material.

3. A structure according to claim 1, wherein said structure is a thermal interconnect.

4. A structure according to claim 1, wherein said thermally conductive fusible coating has a melting temperature less than that of said particle.

5. A structure according to claim 1, further comprising:
   a first surface; and
   a second surface, said structure sandwiched between said first surface and second surface and providing a thermal connection therebetween.

6. A structure according to claim 2, wherein said polymeric material is thermoplastic.

7. A structure according to claim 1, wherein said particles are formed from a material selected from the group consisting of: Cu, Au, Ag, Al, Pd, Pt, diamond coated with Cu, Ni or Pd, aluminum nitride coated with Cu, Ni, or Pd, and boron nitride coated with Cu, Ni or Pd.

8. A structure according to claim 2, wherein said polymeric material is selected from the group consisting of polyimide, siloxane, polyimide siloxane, phenoxy polymers, styrene allyl alcohol and bio-based polymeric resins derived from lignin, cellulose, wood oil and crop oil.

9. A structure according to claim 2, wherein said polymeric material is a thermosetting resin.

10. A structure according to claim 5, wherein said polymeric material provides adhesive joining of said first and said second surfaces.

11. A structure according to claim 5, wherein said first thermally conductive surface is a first electronic device and wherein said second thermally conductive surface is a second electronic device.

12. A structure according to claim 5, wherein said first electronic device is a semiconductor chip and said second electronic device is a packaging substrate.

13. A structure according to claim 5, wherein one of said first and said second thermally conducting surfaces has a low melting point metal surface.

14. A structure according to claim 5, wherein said particles form a metallurgical bond to said first and said second surfaces.

15. A structure according to claim 5, wherein said first and said second surfaces are thermally conducting.

16. A method comprising the steps of:
   providing a paste of particles having a thermally conductive coating thereon, embedded within a polymeric material, wherein said coating is selected from the group consisting of Sn, Zn, In, Bi and Sb, and combinations thereof;
   disposing said paste of particles between a first and second thermally conductive surfaces;
   heating said paste to a first temperature sufficient to fuse said coating on adjacent particles to form a network of interconnected particles with spaces therebetween; and
   heating said paste to a second temperature sufficient to cure or bake said polymer in said spaces.

17. A method according to claim 16, wherein said particles are formed from a material selected from the group consisting of Cu, Ni, Au, Ag, Al, Pd and Pt.

18. A method according to claim 16, wherein said polymeric material is selected from the group consisting of polyimides, siloxanes, polyimide siloxanes, phenoxy polymer, styrene allyl alcohol, bio-based resins made from lignin, cellulose, wood oils, and crop oils, and epoxies.

19. A method according to claim 16, wherein said first thermally conductive surface is a back side of a chip and said second thermally conductive surface is on a substrate, further including the steps of:
   heating and applying pressure to said chip; and
   separating said chip from said substrate.

20. A method according to claim 16, further including the step of:
   pressing said first surface towards said second surface.

21. A method according to claim 16, wherein said first temperature and said second temperature are from about 150° C. to about 250° C.

22. A method according to claim 19, wherein said step of separating is performed by heating in the presence of a solvent.

23. A method according to claim 16, wherein said first thermally conductive surface is a backside of a chip and said second thermally conductive surface is on a heat spreader, further including the steps of:
   heating and applying pressure to said chip; and
   separating said chip from said heat spreader.

24. A method according to claim 16, wherein said first thermally conductive surface is the backside of a chip or a heat sink and said second thermally conductive surface is on a substrate, further including the steps of:

heating and applying pressure to said chip or said heat sink; and separating said chip or heat sink from said substrate.

25. A structure comprising:

particles of copper having a coating selected from the group consisting of Sn and In; and said particles are contained within a thermoplastic polymer precursor and a solvent.

26. A structure according to claim 25, wherein said particles are from about 30% to about 90% by weight of said structure.

27. A structure comprising:

copper powder coated with a layer of a material selected from the group consisting of Sn, In, Bi, Sb and combinations thereof mixed with a fluxing agent.

28. A structure according to claim 27, further including NMP solvent, butyric acid and ethylene glycol and a material selected from the group consisting of polyimide, siloxane, polyimide siloxane, phenoxy polymer, styrene allyl alcohol, a bio-based polymer resin, and epoxies.

29. A structure according to claim 26, wherein said copper powder is from about 30% to about 90% by weight of said structure.

* * * * *